(12) United States Patent
Kono

(10) Patent No.: US 6,529,380 B1
(45) Date of Patent: Mar. 4, 2003

(54) STRUCTURE OF POWER MODULE RADIATION

(75) Inventor: Eiji Kono, Aichi-ken (JP)

(73) Assignee: Kabushiki Kaisha Toyoda Jidoshokki Seisakusho, Kariya (JP)

(*) Notice: Subject to any disclaimer, the term of this patent is extended or adjusted under 35 U.S.C. 154(b) by 14 days.

(21) Appl. No.: 09/699,934

(22) Filed: Oct. 30, 2000

(30) Foreign Application Priority Data

Nov. 4, 1999 (JP) ............................................ 11-313347

(51) Int. Cl.[7] .............................. H01L 21/60; H05J 7/20
(52) U.S. Cl. ....................... 361/708; 361/704; 257/707; 438/117; 437/219
(58) Field of Search ................................ 361/706, 705, 361/704, 707, 708, 713; 257/707, 712, 706, 713; 250/507.1; 438/117; 437/219; 165/80.2, 85; 174/16.3

(56) References Cited

U.S. PATENT DOCUMENTS 5,355,280 A * 10/1994 Rothlingshofer et al. ... 361/705
5,658,831 A * 8/1997 Layton et al. ................. 29/832
6,037,066 A * 3/2000 Kuwabara .................... 428/610

FOREIGN PATENT DOCUMENTS

JP          53-144268          12/1978

* cited by examiner

Primary Examiner—Bruce Anderson
Assistant Examiner—Zia R. Hashmi
(74) Attorney, Agent, or Firm—Morgan & Finnegan, LLP

(57) ABSTRACT

In a power module provided with a semiconductor integrated circuit containing a power element such as a power transistor, etc., a radiation plate for transmitting heat from a semiconductor chip which forms the semiconductor integrated circuit to a heat sink is made of ceramics. A conductive unit is obtained by saturating the upper portion of the ceramics with Cu (copper), Mg (magnesium), and Al (aluminum). A silicon chip 11 is attached to the conductive unit 13a with solder. The lower portion of the ceramics is attached to the heat sink 14 directly or through radiation grease 15. Thus, a resultant power module has a radiation structure with the number of units and the number of steps in an assembly process successfully decreased.

5 Claims, 5 Drawing Sheets

STRUCTURE OF POWER MODULE RADIATION

BACKGROUND OF THE INVENTION

1. Field of the Invention

The present invention relates to the radiation structure of a power module including a semiconductor integrated circuit.

2. Description of the Related Art

Semiconductor integrated circuits have been widely used in various fields including electric cars. Especially, a semiconductor integrated circuit containing a power transistor is used for a device requiring large power. Thus, since a power module including such a power transistor is accompanied by considerable heat, a radiation structure using a heat sink is normally adopted.

FIG. 1 shows the radiation structure of a power module. In FIG. 1, a silicon chip 1 contains a semiconductor integrated circuit, and includes, for example, a power transistor. The silicon chip 1 is attached to a molybdenum plate 3 with solder 2. The molybdenum plate 3 is attached to a radiation plate 5 with silver wax 4. The molybdenum plate 3 is inserted between the silicon chip 1 and the radiation plate 5 because the radiation plate 5 is normally formed by a copper plate whose thermal expansion rate is different from that of the radiation plate 5. That is, when the silicon chip 1 is attached to the radiation plate 5 with solder, the silicon chip 1 and the radiation plate 5 may have a crack due to the difference in thermal expansion rate.

The above mentioned radiation plate 5 is mounted in a heat sink 6 formed by aluminum, etc. The power module shown in FIG. 1 is a non-insulating module, and is attached through an insulating sheet 7 made of a silicon and rubber sheet, etc. The radiation plate 5 and the heat sink 6 are attached using screws not shown in FIG. 1.

However, the radiation structure of the above mentioned power module has the following problems. That is, the above mentioned radiation structure of the power module requires the molybdenum plate 3, and the attachment using solder and silver wax. Therefore, the number of required parts increases, and the number of steps in the assembly process also increases.

When a non-insulating power module is used, the insulating sheet 7 is required. The thermal conductivity of the insulating sheet 7 is normally low, and the entire thermal resistance becomes high even if a single power module has low thermal resistance.

To compensate for the low thermal conductivity of the insulating sheet 7 using the radiation plate 5 of copper (Cu), it is necessary to increase a heat capacity, that is, to have a larger radiation plate 5. However, a larger radiation plate 5 makes a larger and heavier power module.

SUMMARY OF THE INVENTION

The present invention aims at providing the radiation structure of a power module without a insulating sheet, but with a smaller radiation plate to make the power module smaller and lighter, and with a smaller number or steps in an assembly process.

That is, the present invention provides the radiation structure of a power module formed by a semiconductor chip and ceramics including a conductive unit containing metal. The conductive unit includes a radiation plate to which the semiconductor chip is attached with solder, and a heat sink attached to the ceramics portion of the radiation plate.

The semiconductor chip is provided with a power element such as a power transistor, etc., and emits large heat. The radiation plate is made of ceramics, that is, a material having high thermal conductivity. For example, it has a sintered structure of SiC (silicon carbide) or AlN (aluminum nitride) according to claim 3.

In addition, the radiation plate is made of ceramics as described above, and is an excellent radiating and insulating material. To the insulating material with the above mentioned configuration, for example, a metal solution is added to form a conductive unit to which the semiconductor chip is attached with solder to provide the insulating unit with a radiating heat sink.

With the configuration, the radiation plate can be connected as an electrode of a non-insulating power module while the heat sink as a radiating unit of a semiconductor chip can be connected to an insulating portion to efficiently transmit the heat of the semiconductor chip to the heat sink through the radiation plate, thereby performing an efficient radiating process.

DESCRIPTION OF THE PREFERRED EMBODIMENTS

An embodiment of the present invention is described below in detail by referring to the attached drawings.

Figure 1:
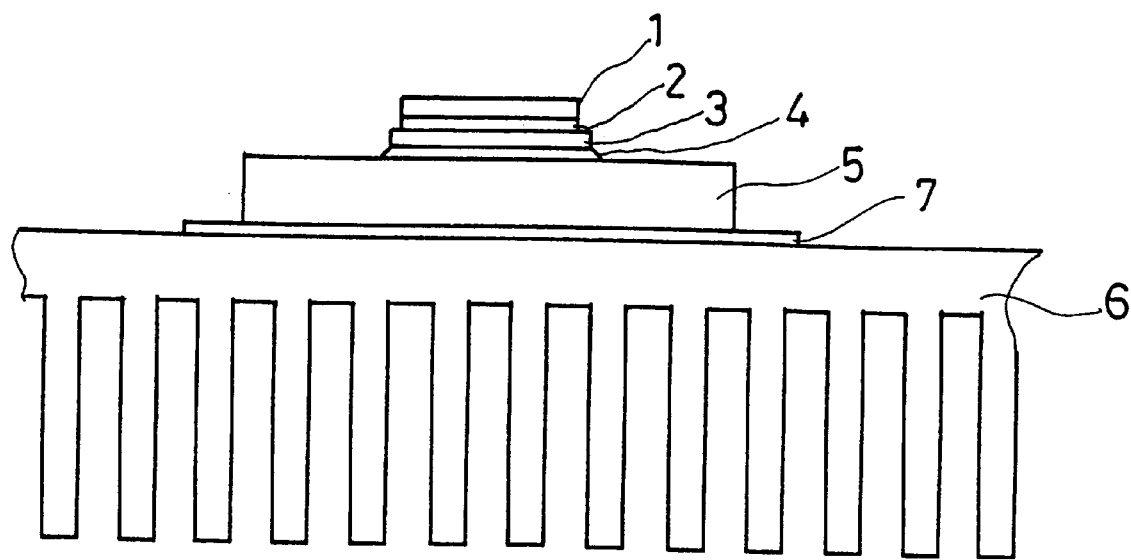
FIG. 1 shows the radiation structure of a power module.
Figure 2:
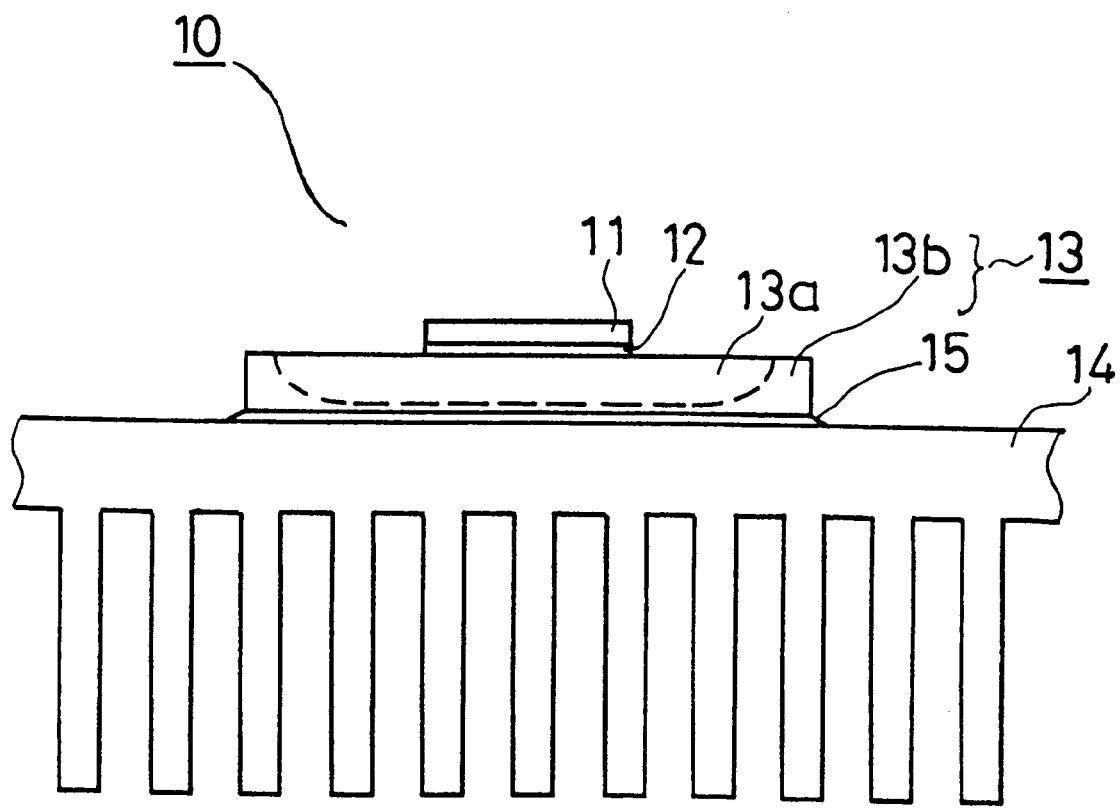
FIG. 2 shows the radiation structure of a power module according to the present embodiment.

FIG. 2 shows the radiation structure of the power module according to the present embodiment. In FIG. 2, a power module 10 according to the present embodiment is used in, for example, a power supply circuit of an electric car, a hybrid car, etc., and is formed by a number of silicon chips, radiation plates, etc. FIG. 2 is a sectional view of the power module 10, and a number of silicon chips are provided in the vertical direction in FIG. 2.

In FIG. 2, a silicon chip 11 contains a heating element such as a power transistor, etc. The silicon chip 11 is attached to a radiation plate 13 with solder 12. The radiation plate 13 is made of radiating ceramics such as SiC (silicon carbide), AlN (aluminum nitride), etc.

The radiation plate 13 comprises a conductive unit 13a and an insulating unit 13b with the section indicated by the dotted line shown in FIG. 2 used as the boundary between them. The conductive unit 13a has the above mentioned material containing conductive Cu (copper), Mg (magnesium), and Al (aluminum). The insulating unit 13b remains the ceramics material.

The above mentioned radiation plate 13 is attached to a heat sink 14. Radiation grease 15 is applied between the radiation plate 13 and the heat sink 14. The radiation grease 15 is used to improve the radiation efficiency from the radiation plate 13 to the heat sink 14. That is, the radiation grease 15 is a paste to fill the space between the radiation plate 13 (13b) and the heat sink 14 and improve the radiation efficiency.

Figure 3:
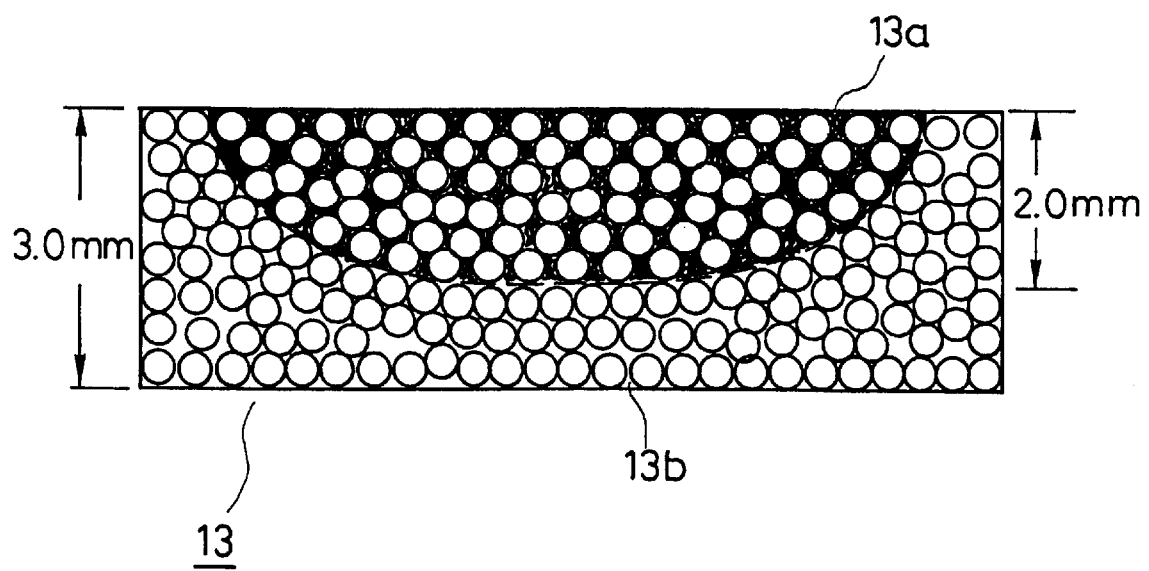
FIG. 3 shows the structure of the radiation plate furthermore in detail.

FIG. 3 shows in detail the structure of the above mentioned radiation plate 13. The radiation plate 13 comprises the conductive unit 13a and the insulating unit 13b. The insulating unit 13b is made of ceramics obtained by sintering SiC (silicon carbide) and AlN (aluminum nitride) only. The conductive unit 13a is obtained by adding the conductive materials such as Cu (copper), Mg (magnesium), and Al (aluminum) to the above mentioned ceramics.

The thickness of the radiation plate 13 is, for example, 3 mm. The maximum thickness of the conductive unit 13a is about 2 mm.

Therefore, with the above mentioned configuration, the upper part of the radiation plate 13 is conductive while the lower part of it is insulating, thereby obtaining the silicon chip 11 attached to the conductive unit 13a with the solder 12. In addition, the heat sink 14 is attached to the insulating unit 13b through the radiation grease 15.

With the above mentioned structure of the power module, the silicon chip 11 emits heat by driving the circuit provided for the silicon chip 11. Especially, larger heat can be generated by driving a power element such as a power transistor, etc. The heat is transmitted to the radiation plate 13 through the solder 12.

As described above, the radiation plate 13 is made of ceramics which is excellent in radiation, and the heat transmitted from the silicon chip 11 through the solder 12 is passed through the conductive unit 13a and insulating unit 13b of the radiation plate 13, and reaches heat sink 14 through the radiation grease 15. The heat can be efficiently radiated by the radiation grease 15 with the heat of the silicon chip 11 efficiently transmitted to the heat sink 14, thereby externally discharging the heat from the heat sink 14.

The power module according to the present embodiment has the conductive unit 13a with Cu (copper) and Mg (magnesium) added to the radiation plate 13, thereby attaching the silicon chip 11 directly to the radiation plate 13 with solder. Accordingly, the conventional molybdenum plate can be deleted, and the process of connecting the molybdenum plate to a radiation plate with wax (silver waxing), etc. can be successfully omitted.

Furthermore, the insulating unit 13b can be attached directly to the heat sink 14 through the radiation grease 15. As a result, a conventional insulating sheet can be omitted. This also improves the radiation efficiency, thereby reducing the number of necessary units. The radiation grease 15 can be, for example, silicon grease obtained by mixing an adjusting agent such as metallic soap with various additives based on silicon oil.

The method of producing the radiation plate 13 used in the present embodiment is practically described below by referring to FIGS. 4 and 5.

Figure 4:
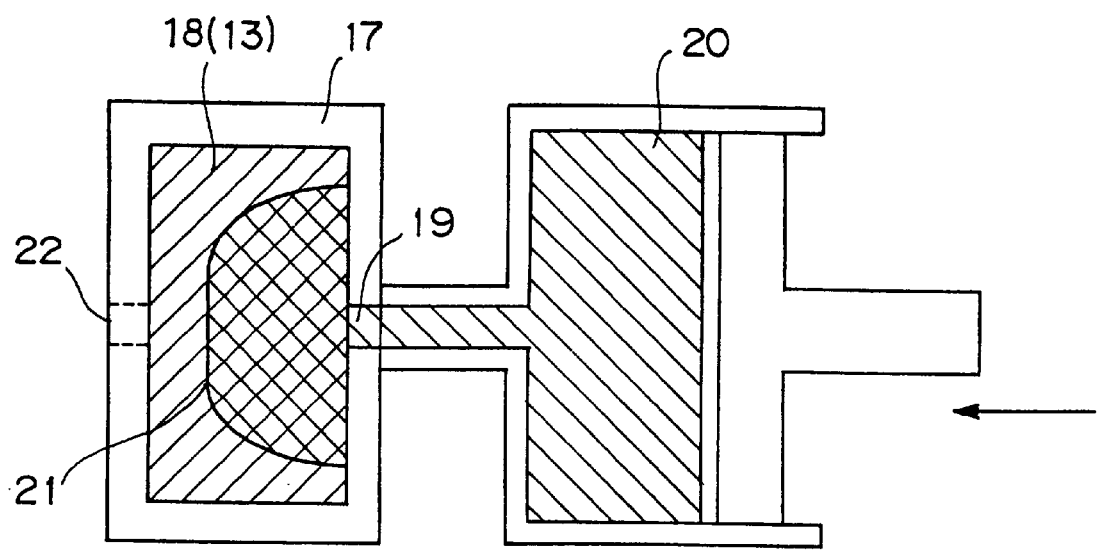
FIG. 4 shows an example of generating a radiation plate according to the present embodiment.

First, FIG. 4 shows an example of a method of producing the radiation plate 13. In the example, a warm solution of aluminum (Al) is added to a predetermined area of the ceramics obtained by sintering the above mentioned Sic (silicon carbide) and AlN (aluminum nitride). That is, as shown in FIG. 4, sintered ceramics 18 (13) is set in a metallic mould 17, and a warm solution of aluminum (Al) 20 is injected from an intake 19 provided in the side of the metallic mould 17. Since the warm solution of aluminum (Al) is added up to the position indicated by a dotted line 21 on the ceramics 18 (13), the temperature, the injecting time, etc. are adjusted. The conditions depend on the thickness and the shape of the conductive unit 13a to be formed.

Under the above mentioned control, the radiation plate 13 shown in FIG. 3 can be produced, and the thickness and the shape of the conductive unit 13a can be freely set by changing the above mentioned conditions.

Furthermore, an intake 22 indicated by the dotted line shown in FIG. 4 can be formed. By injecting an insulating material such as resin, etc. through the intake 22, the injection range of the above mentioned warm solution of aluminum (Al) can also be set.

In addition, a plurality of intakes 19 can be provided in the metallic mould 17 to inject the warm solution of aluminum (Al) through the plurality of intakes.

Figure 5:
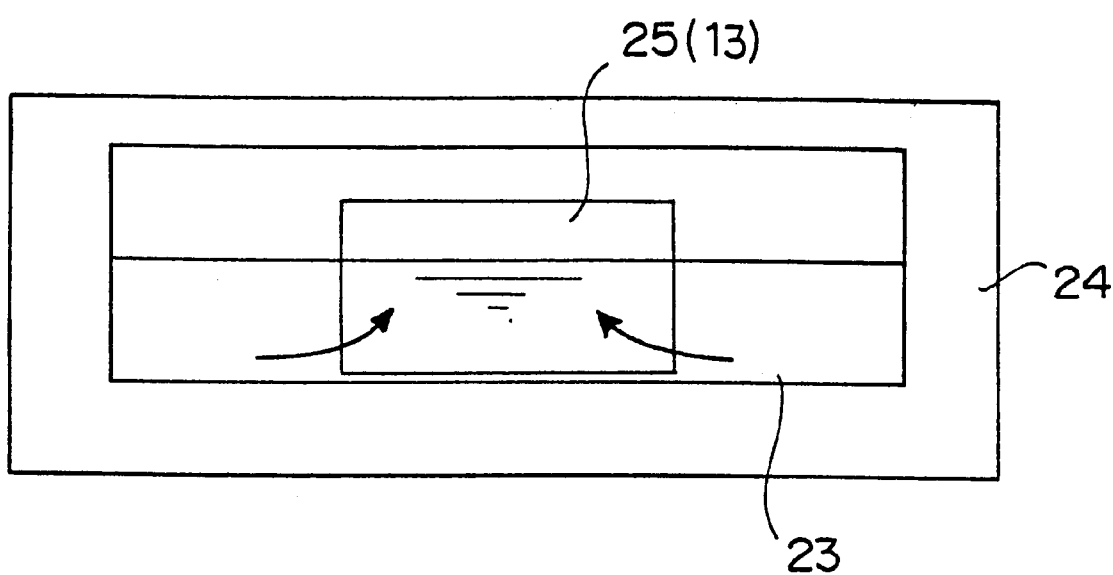
FIG. 5 shows another example of generating a radiation plate according to the present embodiment.

FIG. 5 shows another example of a method of producing the radiation plate 13. In this method, the ceramics obtained by sintering SiC (silicon carbide) and AlN (aluminum nitride) is put in the warm solution of aluminum (Al) to be saturated with aluminum (Al).

That is, in this method, sintered ceramics 25 (13) is put in a container 24 containing a warm solution of aluminum (Al) 23 to saturate the ceramics 25 (13) with aluminum (Al). In this method, by adjusting the amount of the warm solution of aluminum (Al) 23, the ceramics 25 (13) is saturated with the solution of aluminum (Al) through its surface where the ceramics 25 touches the solution of aluminum (Al), thereby forming the conductive unit 13a into a desired shape.

In this case, the conditions of the temperature, etc. are adjusted to form the conductive unit 13a of a desired shape.

According to the explanation of the present embodiment, the ceramics is described as obtained by sintering SiC (silicon carbide) and AlN (aluminum nitride). However, the present invention is not limited to this example, but any material can be applied if it is insulating and radiating such as Al2O3 (alumina).

The material saturating the ceramics can also be any conductive material not limited to the above mentioned Al (aluminum), Cu (copper), and Mg (magnesium).

As described above, according to the present invention, the number of units such as a molybdenum plate, etc. can be reduced, and the number of steps in the assembly process can also be reduced.

Furthermore, according to the present invention, it is not necessary to use a larger radiation plate to increase the amount of radiation, thereby realizing a small and light power module In addition, since ceramics having excellent radiation efficiency is used as a radiation plate, a high efficiency radiation structure can be designed with silicone chips.

What is claimed is:

1. A radiation structure of a power module, comprising:
    a semiconductor chip;
    a ceramics radiation plate having a conductive unit saturated with metal and an insulating unit;
    a solder layer attaching the semiconductor chip to the conductive unit of the radiation plate, wherein the conductive unit can serve as an electrode of the power module;
    a heat sink attached to the insulating unit of the ceramics radiation plate; and
    a heat conductive grease layer between the insulating unit of the ceramics radiation plate and the heat sink.

2. The structure according to claim 1, wherein said ceramics is obtained by sintering SiC (silicon carbide) or Aln (aluminum nitride).

3. The structure according to claim 1 or 2, wherein said conductive unit is saturated with Cu (copper), Mg (magnesium), or Al (aluminum).

4. A method of producing a ceramics radiation plate, comprising:

sintering at least one type of radiating ceramics material;

setting the sintered radiating ceramics material in a metallic mold;

injecting a metallic solution from at least one intake source in the metallic mold to a predetermined area of the sintered radiating ceramics material; and adding insulating material from at least one intake source in the metallic mold to a predetermined area of the sintered radiating ceramics material.

5. A method of producing a ceramics radiation plate, comprising:

sintering at least one type of radiating ceramics material;

placing the sintered radiating ceramics material into a container containing a metallic solution saturated by at least one type of conductive metal; and determining the degree to which the sintered radiating ceramics material is saturated by the conductive metal by adjusting the quantity of metallic solution in the container.

* * * * *